United States Patent
Greiner et al.

(10) Patent No.: US 9,928,321 B2
(45) Date of Patent: *Mar. 27, 2018

(54) SYSTEM AND METHOD FOR GENERATION OF AN INTEGRATED CIRCUIT DESIGN

(71) Applicant: INTERNATIONAL BUSINESS MACHINES CORPORATION, Armonk, NY (US)

(72) Inventors: Carsten Greiner, Holzgerlingen (DE); Gerrit Koch, Ammerbuch (DE); Johannes C. Reichart, Stuttgart (DE); Ralf Winkelmann, Holzgerlingen (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/293,777

(22) Filed: Oct. 14, 2016

(65) Prior Publication Data

US 2017/0344679 A1 Nov. 30, 2017

Related U.S. Application Data

(63) Continuation of application No. 15/166,384, filed on May 27, 2016.

(51) Int. Cl.
*G06F 9/455* (2006.01)
*G06F 17/50* (2006.01)

(52) U.S. Cl.
CPC ................. *G06F 17/5022* (2013.01)

(58) Field of Classification Search
CPC .................................. G06F 17/5045
USPC ........................................... 716/106
See application file for complete search history.

(56) References Cited

U.S. PATENT DOCUMENTS

| | | |
|---|---|---|
| 6,975,975 B2 | 12/2005 | Fasca |
| 7,085,703 B2 | 8/2006 | Gabele et al. |
| 7,143,018 B2 | 11/2006 | Gabele et al. |
| 7,143,019 B2 | 11/2006 | Gabele et al. |
| 8,121,825 B2 | 2/2012 | Jain et al. |
| 8,539,404 B2 | 9/2013 | Craig et al. |
| 8,560,985 B1 | 10/2013 | Sahu et al. |
| 8,904,319 B2 | 12/2014 | Bist et al. |
| 8,904,321 B1 | 12/2014 | Cohen et al. |
| 2003/0101039 A1* | 5/2003 | Gabele ............ G01R 31/318314 703/16 |
| 2005/0080610 A1 | 4/2005 | Toma et al. |

(Continued)

OTHER PUBLICATIONS

IBM: List of IBM Patents or Patent Applications Treated as Related (Appendix P), Oct. 17, 2016, pp. 1-2.

(Continued)

*Primary Examiner* — Suresh Memula
(74) *Attorney, Agent, or Firm* — Reza Sarbakhsh

(57) ABSTRACT

A method for verification of a design of an electronic circuit is provided. The method includes executing test runs of the design. The method further includes increasing a fail counter if the executing of a test run of the test runs failed. The method further includes increasing a pass counter if the executing of the test run of the test runs passed. The method further includes halting the executing of the test runs of the design if the current ratio of the fail counter versus the pass counter exceeds a predetermined threshold.

6 Claims, 4 Drawing Sheets

(56) References Cited

U.S. PATENT DOCUMENTS

2006/0190231 A1  8/2006  Malloy et al.
2010/0057400 A1  3/2010  Chou et al.

OTHER PUBLICATIONS

Rezaeian, "Simulation and Verification Methodology of Mixed Signal Automotive ICs", Nov. 22, 2012, pp. 1-58.
Pending U.S. Appl. No. 15/166,384, filed May 27, 2016, entitled: "System and Method for Generation of an Integrated Circuit Design", pp. 1-27.
IBM: List of IBM Patents or Patent Applications Treated as Related (Appendix P), Oct. 27, 2017, pp. 1-2.
Greiner et al., Pending U.S. Appl. No. 15/166,384, filed May 27, 2016, titled System and Method for Generation of an Integrated Circuit Design, pp. 1-27.
Greiner et al., Pending U.S. Appl. No. 15/794,531, filed Oct. 26, 2017, entitled: "System and Method for Generation of an Integrated Circuit Design", pp. 1-26.
Greiner et al., Pending U.S. Appl. No. 15/794,554, filed Oct. 26, 2017, entitled: "System and Method for Generation of an Integrated Circuit Design", pp. 1-25.
U.S. Appl. No. 15/293,777, filed Oct. 14, 2016.
U.S. Appl. No. 15/166,384, filed May 27, 2016.
U.S. Appl. No. 15/794,531, filed Oct. 26, 2017.
U.S. Appl. No. 15/794,554, filed Oct. 26, 2017.

* cited by examiner

SYSTEM AND METHOD FOR GENERATION OF AN INTEGRATED CIRCUIT DESIGN

BACKGROUND

Modern integrated circuits have billions of discrete elements (e.g. transistors). Before the ultimate goal of an integrated circuit design is reached, i.e. a layout of the integrated circuit design is generated, the design of integrated circuit is generated at various abstraction levels. In some cases only high level synthesis (e.g. design at an electronic system level (ESL) of abstraction) is employed. Using high level synthesis requires utilization of pre-synthesized large block synthesis (LBS) blocks. The major work load in this approach is integration of the LBS blocks. When a library of synthesized LBS blocks is not available there is a need to generate an integrated circuit design a lower level of abstraction, e.g. at register transfer level (RTL) of abstraction. This method requires more resources, but it can provide for an integrated circuit design having a better performance in comparison with an integrated circuit design generated the high level synthesis.

Even when providing of the resources for low level synthesis is not an issue, another problem of the detailed specification of performance of the integrated circuit design at each of hierarchy levels may emerge. Although it might be relatively easy to specify a performance of a single logic gate in low level synthesis, a specification of the electronic circuit design at higher level (e.g. a macro cell or macro) might be problematic, because these specifications can imply unnecessary limitations for architectural solutions. For instance, a design of a microprocessor can be specified at high level, just by clock frequency, functionality of input/output ports, and a number of operations it has to perform per second. As a result thereof the choice of other parameters, e.g. data capacity and internal architecture of a first level cache and a second level cache, is free. Low level synthesis, e.g. at RTL of abstraction, requires these parameters to be known upfront. These parameters can be included in optimization procedure of the electronic level design at RTL of abstraction as variables. However, this approach might result in a very long design procedure because too many variables have to be optimized simultaneously.

SUMMARY

One aspect of the present invention provides a method of verification of a design of an electronic circuit (IC), a computer system comprising a computer processor and a memory storing a processor executable code which execution causes the computer the computer system to perform the method, and a computer readable medium having stored there on a computer executable code for execution by a computer processor controlling a computer system comprising a memory, wherein execution of the instructions of the executable code causes the computer processor to execute the method. One embodiment provides for a method of verification of a design of an electronic circuit. The method comprises the following: executing test runs of the design; increasing a fail counter if the executing of a test run of the test runs failed; increasing a pass counter if the executing of the test run of the test runs passed; and halting the executing of the test runs of the design if the current ratio of the fail counter versus the pass counter exceeds a predetermined threshold. Another embodiment provides for a computer system comprising a computer processor and a memory storing a processor executable code. The execution of the processor executable code by processor causes the computer system to perform the aforementioned method verification of the design of the electronic circuit. Another embodiment provides for a computer readable medium having stored there on a computer executable code for execution by a computer processor controlling a computer system comprising a memory.

The execution of the instructions of the executable code causes the computer processor to execute the aforementioned method of verification of the design of the electronic circuit, wherein the generating of the design of the electronic circuit at the ESL according to the architecture specification is performed in a format of a Transaction Level Modelling, TLM, wherein the architecture specification comprises an algorithmic description of the electronic circuit, wherein the design of the electronic circuit at the ESL according to the architecture specification is generated using at least one of the following tools: C/C++, Specman, and e Language, wherein the design of the electronic circuit at the RTL according to the architecture specification is generated using at least one of the following tools: Verilog and VHDL, wherein the executing of the test runs is performed on a computer system configured to provide a verification software platform for the execution of the test runs of the design of the electronic circuit generated at the ESL and a device under test, DUT, software platform for execution of the test runs of the design of the electronic circuit generated at the RTL, wherein the computer system is communicatively coupled with a server, wherein the executing of the test runs of the design is operated by a test management component of the computer system, wherein the increasing of the fail counter and the increasing of the pass counter is performed by the test management component, wherein the increasing of the fail counter comprises: sending by the computer system a fail record to the server; wherein the increasing of the pass counter comprises sending by the computer system a success record to the server, wherein the server is communicatively coupled to a database configured to store the pass counter and the fail counter, the method comprising: increasing the pass counter by the server in the database by unity in response to the receiving of the success record from the computer system and increasing the fail counter by the server in the database by unity in response to the receiving of the fail record from the computer system, wherein the storing of the description of the characteristic functional behavior of the design and the identification of the test run which execution has caused the halting of the executing of the test runs of the design is executed by the server and comprises: storing the description of the characteristic functional behavior of the design and the identification of the test run which execution has caused the halting of the executing of the test runs of the design in the database. The method further comprises sending by the sever to the test management component a failure record if the current ratio of the fail counter versus the pass counter exceeds the predetermined threshold receiving by the test management component the failure record from the server, wherein the halting of the executing of the test runs of the design is executed by the test management component in response to the receiving of the failure record from the server.

BRIEF DESCRIPTION OF THE SEVERAL VIEWS OF THE DRAWINGS

In the following embodiments of the invention are explained in greater detail, by way of example only, making reference to the drawings in which.

DETAILED DESCRIPTION

Figure 1:
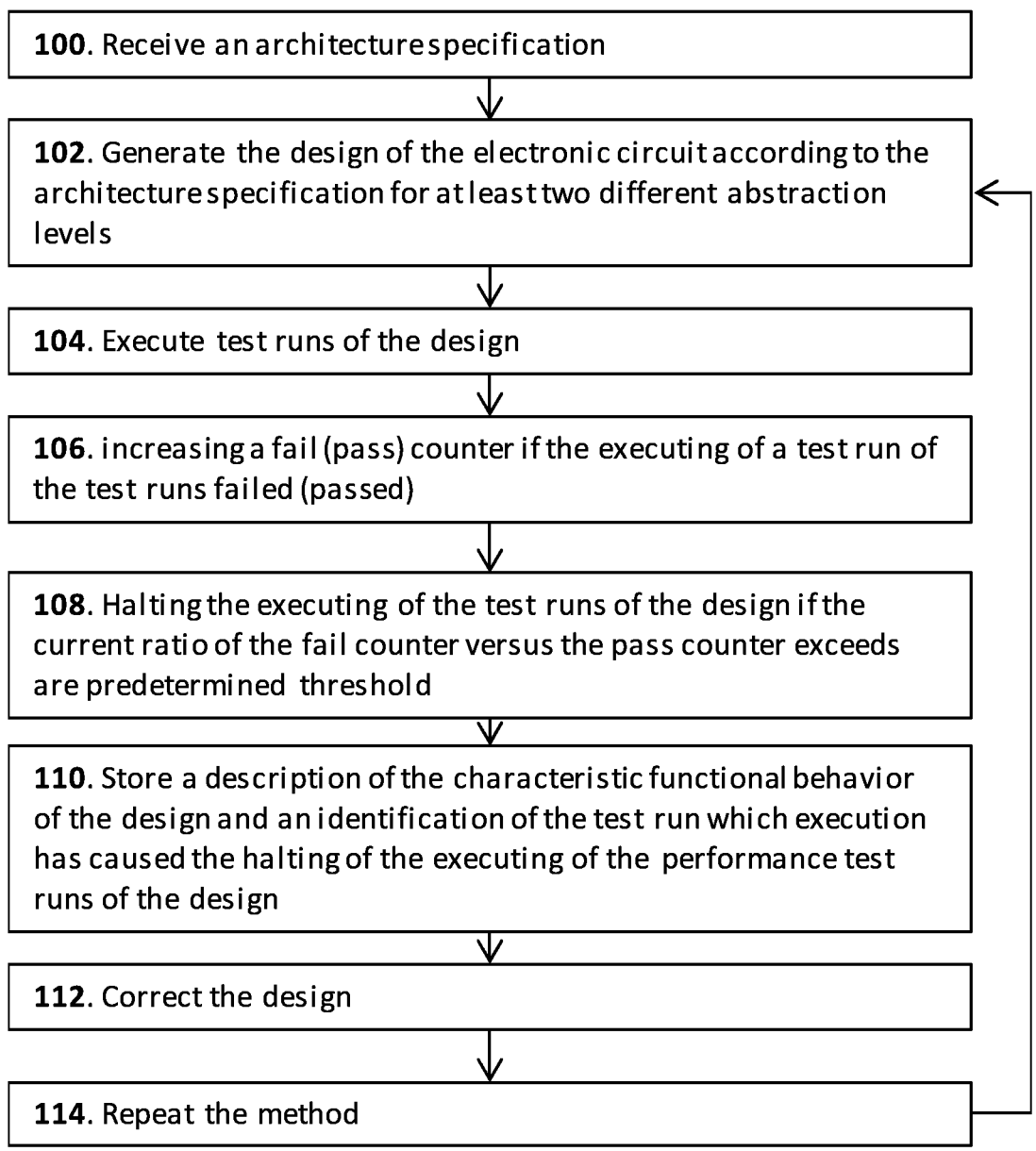
FIG. 1 depicts a flow diagram of a method.

Development of low level synthesis design of an IC uses as usual as starting point only high level specifications leaving a lot of freedom for choosing particular architectures of building blocks of the IC, such as caches, data busses, processor cores, etc. Detailed specifications for each of these building blocks can result in unnecessary limitations for a process of IC design development, because it is the overall performance of these building blocks which determines the ultimate performance of the IC. For instance, enhancing of a processor cache performance might be more favorable instead of enhancing of a performance of a data bus connecting processor cores of IC. On the other hand, once the IC design is completed there is a need to verify its functional performance, in particular a functional performance of its building blocks which was not originally specified. The ultimate goal of functional verification is to prove, that the device under test conforms to the architecture specification and, if available, micro-architecture specification. This is achieved in logic simulation by implementing another reference design at a higher abstraction level than the design to be verified. For instance, when the design to be verified is an RTL design, a design generated at electronic system level (ESL) of abstraction can be used for verification of the RTL design. The ESL design can be capable of predicting performance of the RTL design at a high level, e.g. at the ESL level. When a characteristic functional behavior of the RTL design is worse than a characteristic functional behavior of the ESL design, it might be an indication that an architectural solution used in the RTL design is not optimal and might need an improvement.

A common problem in this area is, that the specification allows a high number of degrees of freedom in implementing of certain functionality and also leaves scenarios unspecified. An example of such scenarios are performance relevant functionalities, where it might be architectural compliant to perform a high number of attempts before completing the requested function, but not acceptable from an overall system perspective.

The present invention may provide a tool to leverage a need to verify various aspects of IC design and a need to minimize resources needed therefore and as a consequence reduce workload of optimization of the IC design. This is because comparison of the performance of the design being verified and the performance of the reference design is performed in a flexible way. The failure of a particular functionality of the design being verified is determined only when its performance shows persisting inferior performance in comparison with the corresponding functionality of the reference design.

In another embodiment, in the method further comprises: correcting the design in response to the halting of the executing of the test runs of the design and after the correcting of the design in response to the halting of the executing of the test runs of the design repeating execution of the method.

This embodiment may be advantageous because it may provide for iterative optimization of IC design.

In another embodiment, the executing of the test runs of the design is halted if the sum of the fail and pass counter is bigger than another predetermined threshold.

This embodiment may be advantageous because it may provide for collection of sufficient data before halting of the executing of the test runs.

In another embodiment, the method comprises the following: receiving an architecture specification of the electronic circuit and generating the design of the electronic circuit according to the architecture specification for at least two different abstraction levels, the executing of the test runs being performed for the at least two different abstraction levels in parallel or sequentially.

This embodiment may be advantageous because it may provide for two difference IC designs, which are generated according to different principles. The discrepancies between performances of different designs can provide for optimization routes.

In another embodiment, in case a characteristic functional behavior of the design generated at one of the abstraction levels evaluated in a course of the execution of the test run complies with a characteristic functional behavior of the design generated at another one of the abstraction levels evaluated in a course of the execution of the same test run, the executing of said test run is considered having passed otherwise the executing of said test run is considered having failed.

Characteristic functional behavior is understood here in a broad sense. The characteristic functional behavior can comprise a performance parameter of a particular functionality of a design which was activated in a course of an execution of a test run (e.g. whether the requested data is found and retrieved from cache). The characteristic functional behavior can comprise an integral performance characteristic of a design like a power consumption registered in a course of an execution of a test run.

This embodiment can be advantageous because it may specify an effective criterion of performance of the designs generated at different abstraction levels.

In another embodiment, the abstraction levels comprise a register transfer level, RTL, of abstraction and at an electronic system level, ESL, of abstraction.

This embodiment can be advantageous because it may provide optimum abstraction levels for generation of IC designs which performance is compared in the verification of the IC design.

In another embodiment, the halting of the executing of the test runs of the design comprises storing a description of the characteristic functional behavior of the design and an identification of the test run which execution has caused the halting of the executing of the performance test runs of the design.

This embodiment may be advantageous because it may provide for data acquisition, which can be used for debugging of the IC design.

In another embodiment, the design of the electronic circuit at the ESL according to the architecture specification is generated using at least one of the following tools: C/C++, Specman, and e Language.

This embodiment can be advantageous because it may provide for optimum tools for the generation of the ESL design.

In another embodiment, the design of the electronic circuit at the RTL according to the architecture specification is generated using at least one of the following tools: Verilog and VHDL.

This embodiment can provide advantages, because it may provide for optimum tools for the generation of the RTL design.

In another embodiment, the executing of the test runs is performed on a computer system configured to provide a verification software platform for the execution of the test runs of the design of the electronic circuit generated at the ESL and a device under test, DUT, software platform for execution of the test runs of the design of the electronic circuit generated at the RTL.

This embodiment can be advantageous because if provides for two separate computer platforms for execution of the designs generated at different levels of abstraction. As a result thereof the designs can be tested in parallel on software platforms which can be customized for supporting of the respective design.

In another embodiment, the computer system is communicatively coupled with a server. The executing of the test runs of the design is operated by a test management component of the computer system. The increasing of the fail counter and the increasing of the pass counter is performed by the test management component, wherein the increasing of the fail counter comprises sending by the computer system a fail record to the server. The increasing of the pass counter comprises sending by the computer system a success record to the server. The server is communicatively coupled to a database configured to store the pass counter and the fail counter. The method further comprises: increasing the pass counter by the server in the database by unity in response to the receiving of the success record from the computer system and increasing the fail counter by the server in the database by unity in response to the receiving of the fail record from the computer system.

This embodiment can be advantageous, because it may provide for an optimum computer cluster architecture for verification of the IC design. The components of the computer architecture have specialized functions enabling optimum performance of the computer cluster.

In another embodiment the storing of the description of the performance characteristic of the design and the identification of the test run which execution has caused the halting of the executing of the test runs of the design is executed by the server and comprises storing the description of the performance characteristic of the design and the identification of the test run which execution has caused the halting of the executing of the test runs of the design in the database.

This embodiment can be advantageous, because it may provide for the database storing of failures during verification of the IC design. The database can enable statistical analysis of different failures, cross-correlation between different failures, etc.

In another embodiment, the method comprises the following: sending by the sever to the test management component a failure record if the current ratio of the fail counter versus the pass counter exceeds the predetermined threshold and receiving by the test management component the failure record from the server, wherein the halting of the executing of the test runs of the design is executed by the test management component in response to the receiving of the failure record from the server.

This embodiment can be advantageous because it may provide further functional specification of components of the computer cluster for verification of the IC design.

Figure 2:
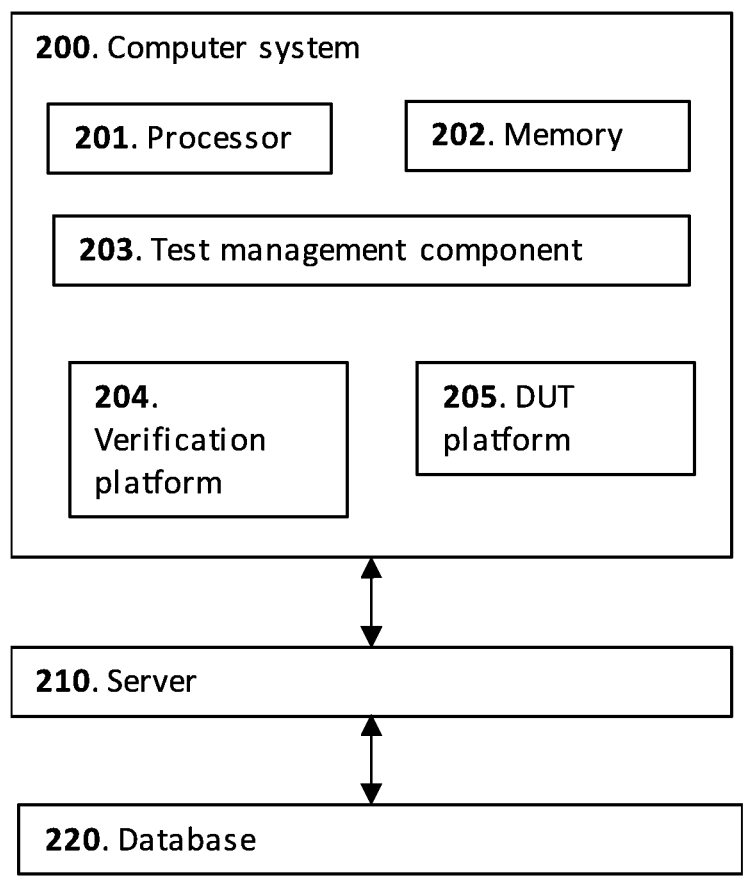
FIG. 2 depicts a block diagram of a computer system.

FIG. 1 depicts a flow diagram of a computer-implemented method of verification of a design of an electronic circuit. The method can be implemented on a computer cluster depicted on FIG. 2. A computer system 200 of the computer cluster can comprise a computer processor 201 and a memory 202 storing computer executable code which when executed by the computer processor causes the computer processor to execute the computer-implemented method. The method begins with process block 100. In this process block an architecture specification of the IC is received. The specification can be formulated at macro level (e.g. clock frequency, number of cores of a processor, internal/external input/output ports, number of caches, etc.). In addition the specification can be formulated at a level of micro-architecture (i.e. purpose and functioning of particular registers of a CPU core, communication between a CPU core and a first level cache, etc.). The architecture specification can further comprise an algorithmic description of the IC.

Process block 102 is executed after process block 100. In process block 102 the design of the electronic circuit is generated according to the architecture specification for at least two different abstraction levels. One of the abstraction levels can be an RTL, while another one of the abstraction levels can be ESL. The IC design of the electronic circuit at the ESL according to the architecture specification can be implemented in a format of a Transaction Level Modelling. The IC design of the electronic circuit at the ESL according to the architecture specification can be generated using at least one of the following tools: C/C++, Specman, and e Language. The design of the electronic circuit at the RTL according to the architecture specification can be generated using at least one of the following tools: Verilog and VHDL. The design can be implemented using computer system 200 and/or other systems of the computer cluster depicted on FIG. 2.

Process block 104 is executed after process block 102. In process block 104 test runs are executed of the design. The execution of test runs can be planned and/or managed by a test management component 203 of computer system 200. The test management component can be configured to start/stop execution of the test runs. It can be further configured to receive and to process information from other components of the computer cluster (e.g. server 210 and database 220). Processing of the received information can result in modification of the execution schedule of the test run or stopping of the execution of the test runs. The computer system 200 can be configured to provide a verification platform 204 for the execution of the test runs of the design of the electronic circuit generated at one of the abstraction levels (e.g. ESL) and a device under test (DUT) platform 205 for execution of the test runs of the design of the electronic circuit generated at another one of the abstraction levels (e.g. RTL). The executing of the test runs can be performed for the at least two different abstraction levels in parallel or sequentially. The test run can be a computer processor executable code which is executed by the IC design as a virtual processor. In a test run a plurality of virtual signals can be provided at particular nodes of the IC design. The test run can reveal not only design failures but performance parameters of various functionalities such as: a number of operations performed by a processor which design is being verified, a ratio of cache hit and cache miss cases, a number of tact cycles needed for executing of a particular operation.

Process block 106 is executed after starting execution of process block 104. In process block 106 a fail counter is increased if the executing of a test run of the test runs failed in process block 104 and a pass counter if the executing of the test run of the test runs passed in process block 104. A pair of pass and fail counters can be assigned to each of the functionalities to be monitored. For instance, when a cache performance is to be monitored, a pass counter is increased when it took the same number of tact cycles to get information from the cache in both of the designs generated at different abstraction levels (e.g. ESL and RTL) and the fail counter is increased when it took different number of tact cycles to get information from the cache in said designs generated at different abstraction levels (for instance when it took more tact cycles to get information from the cache of the RTL design than getting information from the cache of the ESL design). In the light of the aforementioned example, the operation of the pass and the fail counter for a particular functionality which performance is comprised in the characteristic functional behavior of the design can be formulated as follows. In case a characteristic of a performance event of a functionality of the design generated at one of the abstraction levels activated in a course of the execution of the test run complies with a characteristic of a performance event of the same functionality of the reference design generated at another one of the abstraction levels activated in a course of the execution of the same test run, the executing of said test run is considered having passed otherwise the executing of said test run is considered having failed.

A pair of pass and fail counter can be assigned to monitoring of a performance characteristic comprised in the characteristic functional behavior as well. It can be an integral performance characteristic. For instance, it can be a power consumption of the RTL design and a power consumption of the ESL design. In this case operation of this pair of pass and fail counter can be formulated as follows. In case a performance characteristic characterizing an integral performance characteristic of the design generated at one of the abstraction levels evaluated in a course of the execution of the test run complies with a performance characteristic characterizing the same integral performance characteristic of the design generated at another one of the abstraction levels activated in a course of the execution of the same test run, the executing of said test run is considered having passed, otherwise the executing of said test run is considered having failed.

Increasing of the pass counter and the fail counter can be performed by the test management component 203 of the computer system 200. The test management system can cause the computer system 200 being communicatively coupled (e.g. via computer network) with a server 210 to send a fail record to the server when the fail counter is to be increased and to send a success record to the server when the success counter is to be increased. The server 210 can be communicatively coupled (e.g. via a computer network) to a database 220 configured to store the pass counter and the fail counter. The server can be configured to increase the pass counter in the database by unity in response to the receiving of the success record from the computer system and to increase the fail counter by the server in the database by unity in response to the receiving of the fail record from the computer system.

Process block 108 is executed after starting execution of process block 106. In process block 108 the executing of the test runs of the design in process block 104 is halted if the current ratio of the fail counter versus the pass counter exceeds a predetermined threshold. The aforementioned criterion for the halting of the execution of the test runs can be extended by additional criterion providing for collecting of sufficient data before halting the execution of the test runs. The additional criterion can be formulated as follows. The executing of the test runs of the design is halted if the sum of the fail and pass counter is bigger than another predetermined threshold. When the additional criterion is applied an ambiguous case when a single failure of the test run is registered first and a result thereof the current ratio of fail counter versus the pass counter is equal to unity divided by zero (i.e. the current ratio is bigger than any possible predetermined threshold) is avoided. The current to pass ratio can be monitored by the server 210. It can send to the test management component 203 a failure record if the aforementioned criterion or criteria are fulfilled. The test management component 203 can halt the executing of the test runs of the design in response to the receiving of the failure record from the server.

Process block 110 is executed after process block 108. In process block 110 a description of the characteristic functional behavior and an identification of the test run which execution has caused the halting of the executing of the performance test runs of the design is stored. This can be performed by the server, which can store the description of the characteristic functional behavior and the identification of the test run in the database 220. The information stored in the database can be further used for statistical analysis of the failures and/or underperformance of the IC design which is being verified.

Process block 112 is executed after process block 110. In process block the IC design is corrected in response to the halting of the executing of the test runs of the design. For instance, if the receiving of data stored in a cache of the design being verified (e.g. RTL design) takes more tact cycles that receiving of data stored in the same cache of the reference design (e.g. ESL design) then there might be a need to improve the architecture of the cache in the design being verified.

Process block 114 is executed after process block 112. In process block 114 execution of the method can be restarted from process block 102.

Figure 3:
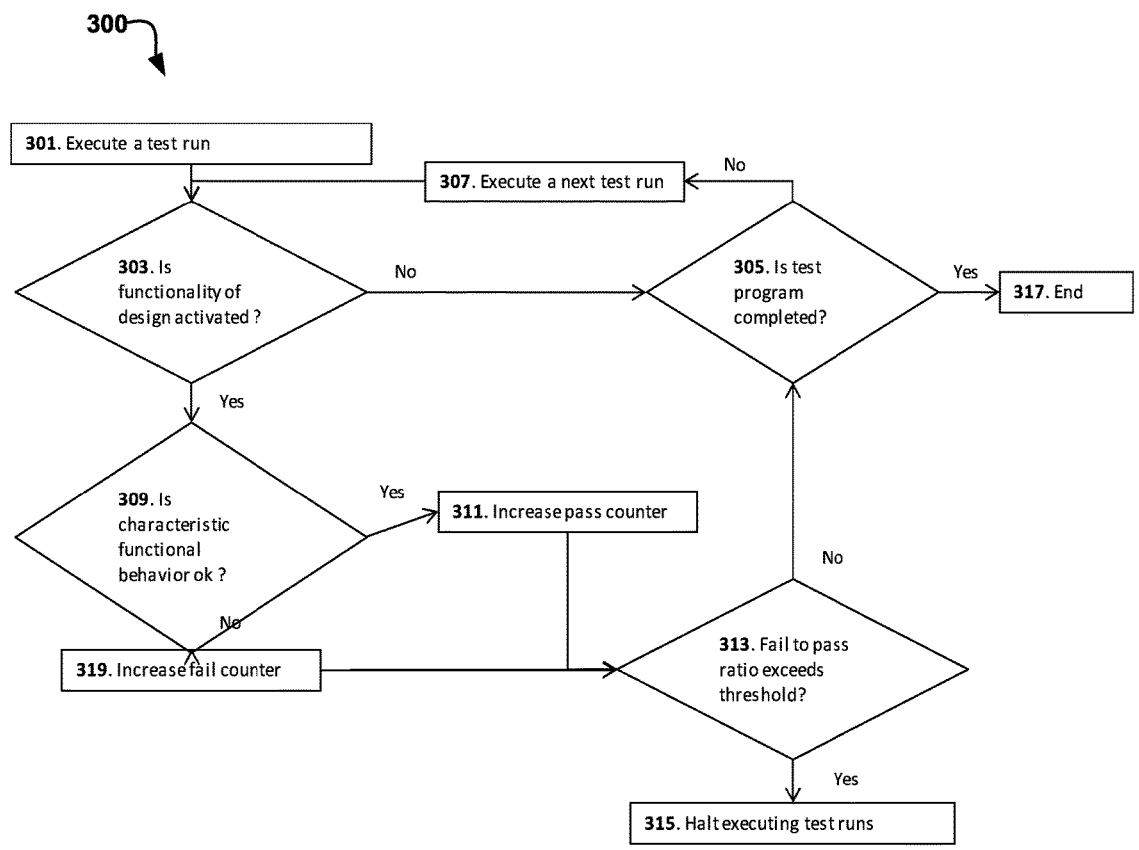
FIG. 3 depicts a flow diagram of a method.

FIG. 3 depicts process blocks 300 of the method depicted in FIG. 1 in greater detail. The method depicted on FIG. 3 starts with the process block 301 which can be comprised in the process block 104. In process block 301 a test run is executed, its execution can be started by the test management component 203.

Decision process block 303 is executed after process block 301. Decision process block 303 causes execution of decision process block 309 if a functionality of the design was activated (e.g. getting data from cache), otherwise it causes execution of a decision process block 305. Decision process block 303 can be executed by the decision process block 303. Decision process block 301 is not executed when a characteristic functional behavior like an (integral) performance characteristic (e.g. power consumption during the test run) is evaluated throughout the test run. In this case the relevant characteristic functional behavior which may be expressed in terms of performance data is evaluated after the execution of test run. There may be no need to execute decision process block 301 and decision process block 309 is executed after process block 301.

Decision process block 309 causes execution of process block 311 when a characteristic functional behavior which again may be expressed by a certain performance parameter (e.g. an (integral) performance characteristic like power consumption) complies with the requirements, otherwise it causes execution of process block 319. Performance of the functionality can be determined as described above. Decision process block can be executed by the test management component 203.

In process block 311 the pass counter associated with the aforementioned characteristic functional behavior is increased. In process block 319 the fail counter associated with the aforementioned characteristic functional behavior is increased. Process blocks 311 and 319 can be executed by the test management component 203 in conjunction with the server 210 and the database 220 as described above. Process blocks 303, 309, 311, and 319 can be comprised in process block 106.

Decision process block 313 causes execution of process block 315 when the current ratio of the fail counter versus the pass counter exceeds the predetermined threshold, otherwise it causes execution of decision process block 305. Decision process block can be comprised in process block 108. Decision process block 313 can be executed by the test management component 203 in conjunction with the sever 210 and the database 220 as described above.

In process block 315 the executing of the test runs of the design is halted. It can be executed by the test management component 203. Process block 315 can be comprised in process block 108.

Decision process block 305 causes execution of process block 317 when a test program is completed (e.g. all scheduled test runs are executed), otherwise it causes execution of process block 307. Decision process block 305 can be executed by the test management component 203. Decision process block 305 can be comprised in process block 104.

In process block 317 the execution of the test runs of the design is ended. Process block 317 can be executed by the test management component 203. Process block 317 can be comprised in process block 104.

In process block 307 another test run of the design is executed. Process block 307 can be executed by the test management component 203. Process block 307 can be comprised in process block 104. Decision process block 303 is executed after process block 307.

The methods depicted on FIGS. 1 and 3 can executed such that several functionalities of the IC design are simultaneously monitored, i.e. each of the functionalities has its own respective pair of pass and fail counters. It can be implemented when for each of the functionalities process blocks 303, 309, 319, 311, and 313 are executed.

Figure 4:
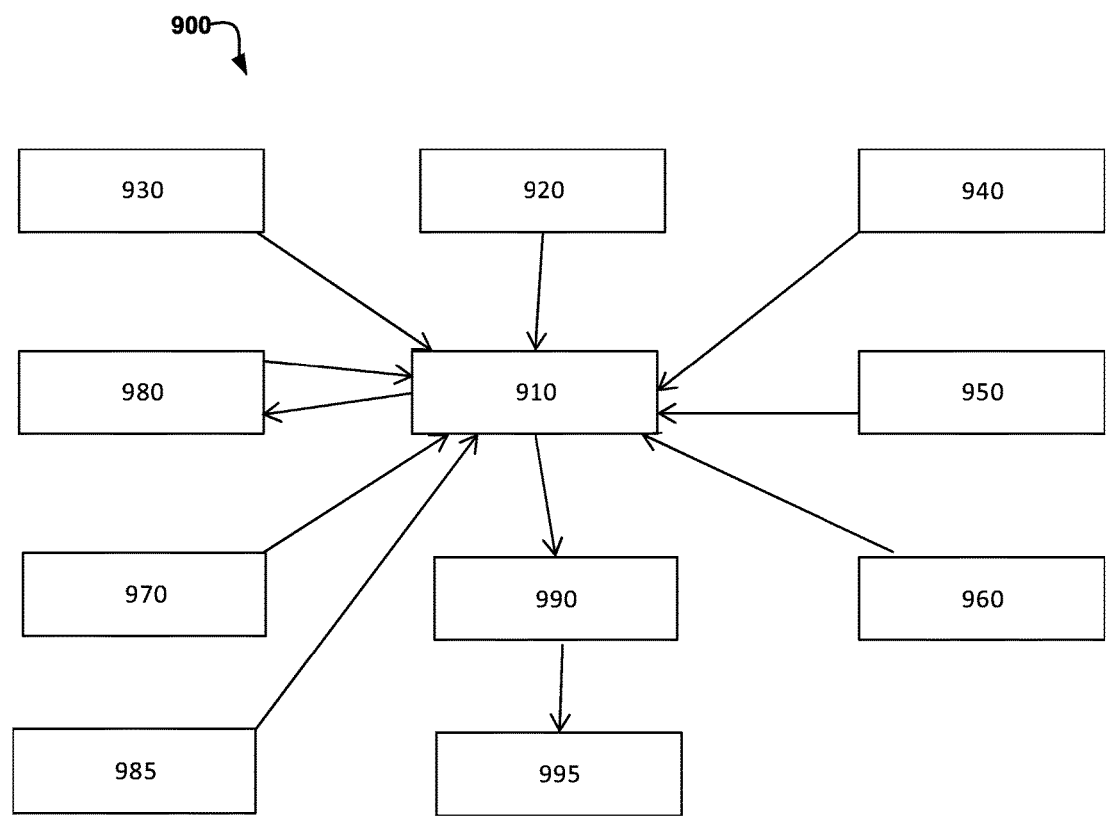
FIG. 4 depicts a flow diagram of a design process used in semiconductor design, manufacture, and/or test.

FIG. 4 is a flow diagram of a design process used in semiconductor design, manufacture, and/or test. The process of verifying of the IC design, which flow diagrams are depicted on FIGS. 1 and 3, can be a part of the design process depicted on FIG. 4. FIG. 4 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 4 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system which design verification is depicted in FIGS. 1 and 3. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structure which design verification is shown in FIGS. 1 and 3 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 20 nm, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-3. In one embodiment, design structure 990 may comprise a compiled, executable HDL simulation model that functionally simulates the devices which design verification shown in FIGS. 1 and 3.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and which design verification is shown in FIGS. 1 and 3. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded there on, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of verification of a design of an electronic circuit, comprising:
    executing test runs of the design;
    increasing a fail counter if the executing of a test run of the test runs failed;
    increasing a pass counter if the executing of the test run of the test runs passed;
    halting the executing of the test runs of the design if the current ratio of the fail counter versus the pass counter exceeds a predetermined threshold;
    receiving an architecture specification of the electronic circuit; and
    generating the design of the electronic circuit according to the architecture specification for at least two different abstraction levels, the executing of the test runs being performed for the at least two different abstraction levels in parallel or sequentially.

2. The method of claim 1, comprising:
    correcting the design in response to the halting of the executing of the test runs of the design; and
    after the correcting of the design in response to the halting of the executing of the test runs of the design repeating execution of the method.

3. The method of claim 1, wherein the executing of the test runs of the design is halted if the sum of the fail and pass counter is bigger than another predetermined threshold.

4. The method of claim 1, wherein in case a characteristic functional behavior of the design generated at one of the abstraction levels evaluated in a course of the execution of the test run complies with a characteristic functional behavior of the design generated at another one of the abstraction levels evaluated in a course of the execution of the same test run, the executing of said test run is considered having passed otherwise the executing of said test run is considered having failed.

5. The method of claim 4, wherein the halting of the executing of the test runs of the design comprises: storing a description of the characteristic functional behavior of the design and an identification of the test run which execution has caused the halting of the executing of the performance test runs of the design.

6. The method of claim 1, the abstraction levels comprising: a register transfer level, RTL, of abstraction and at an electronic system level, ESL, of abstraction.

* * * * *